(12) United States Patent
Forbes

(10) Patent No.: US 6,999,351 B2
(45) Date of Patent: Feb. 14, 2006

(54) COMPUTER SYSTEMS, PROCESSES FOR TURNING A SRAM CELL OFF, AND PROCESSES FOR WRITING A SRAM CELL AND PROCESSES FOR READING DATA FROM A SRAM CELL

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/820,568

(22) Filed: Apr. 7, 2004

(65) Prior Publication Data
US 2004/0196683 A1    Oct. 7, 2004

Related U.S. Application Data

(62) Division of application No. 10/459,064, filed on Jun. 10, 2003, now Pat. No. 6,919,254, which is a division of application No. 10/202,551, filed on Jul. 23, 2002, now Pat. No. 6,888,740, which is a division of application No. 09/941,369, filed on Aug. 28, 2001, now abandoned.

(51) Int. Cl.
  *G11C 7/00* (2006.01)
(52) U.S. Cl. ............... 365/189.01; 365/154; 365/174; 365/188; 365/189.03
(58) Field of Classification Search .......... 365/189.01, 365/154, 174, 189.03, 188
See application file for complete search history.

(56) References Cited

U.S. PATENT DOCUMENTS

| | | | |
|---|---|---|---|
| 5,255,230 A * | 10/1993 | Chan et al. ................. 365/201 |
| 5,285,687 A | 2/1994 | Ringle et al. |
| 5,388,068 A | 2/1995 | Ghoshal et al. |
| 5,754,010 A | 5/1998 | Caravella et al. |
| 5,754,468 A | 5/1998 | Hobson |
| 5,774,392 A | 6/1998 | Kraus et al. |
| 5,825,687 A | 10/1998 | Yin |
| 5,920,517 A * | 7/1999 | Wendell ..................... 365/226 |
| 5,986,932 A * | 11/1999 | Ratnakumar et al. .. 365/185.07 |

(Continued)

FOREIGN PATENT DOCUMENTS

JP         10-335488         12/1998

(Continued)

OTHER PUBLICATIONS

Lage et al., "*Advanced SRAM technology—the rate between 4T and 6T cells*," Abstract (Web address—http://pluto.e-i.org), Technical Digest—Proceedings of the 1996 IEEE International Electron Devices Meeting Dec. 8-11, 1996.

(Continued)

*Primary Examiner*—Viet Q. Nguyen
(74) *Attorney, Agent, or Firm*—Wells St. John, P.S.

(57) ABSTRACT

A two-transistor SRAM cell includes a first FET. The first FET is an ultrathin FET of a first polarity type and includes a control electrode, a first load electrode and a second electrode. The first load electrode is coupled to a first control line. The SRAM cell also includes a second FET. The second FET is an ultrathin FET of a second polarity type and includes a gate, a source and a drain. The second FET source is coupled to the first FET gate. The second FET gate is coupled to the first FET drain and the second FET source is coupled to a first potential. The SRAM cell further includes a first load device that is coupled between a second potential and the first FET gate. The SRAM cell additionally includes a second load device coupled between the second FET gate and a second control line.

6 Claims, 8 Drawing Sheets

U.S. PATENT DOCUMENTS

| | | | |
|---|---|---|---|
| 6,011,726 | A | 1/2000 | Batson et al. |
| 6,057,555 | A | 5/2000 | Reedy et al. |
| 6,090,648 | A | 7/2000 | Reedy et al. |
| 6,104,045 | A | 8/2000 | Forbes et al. |
| 6,128,216 | A | 10/2000 | Noble, Jr. et al. |
| 6,184,588 | B1 | 2/2001 | Kim et al. |
| 6,194,759 | B1 | 2/2001 | Sano et al. |
| 6,208,555 | B1 | 3/2001 | Noble |
| 6,212,102 | B1 | 4/2001 | Georgakos et al. |
| 6,225,165 | B1 | 5/2001 | Noble, Jr. et al. |
| 6,265,266 | B1 | 7/2001 | Dejenfelt et al. |
| 6,275,433 | B1 | 8/2001 | Forbes |
| 6,287,913 | B1 | 9/2001 | Agnello et al. |
| 6,342,718 | B1 | 1/2002 | Noble |
| 6,373,745 | B1 * | 4/2002 | Saito et al. ................ 365/174 |
| 6,448,601 | B1 | 9/2002 | Forbes et al. |
| 6,449,186 | B1 | 9/2002 | Noble |
| 6,459,113 | B1 | 10/2002 | Morihara et al. |
| 6,519,197 | B1 | 2/2003 | Forbes |
| 6,603,361 | B1 | 8/2003 | Carobolante |
| 6,813,180 | B1 | 11/2004 | Forbes |
| 2001/0015907 | A1 | 8/2001 | Noble |
| 2002/0028550 | A1 | 3/2002 | Moribara et al. |
| 2003/0015907 | A1 | 1/2003 | Forbes |
| 2003/0048656 | A1 | 3/2003 | Forbes |
| 2003/0048657 | A1 | 3/2003 | Forbes |
| 2003/0076721 | A1 | 4/2003 | Forbes |
| 2003/0214840 | A1 | 11/2003 | Forbes |
| 2004/0026697 | A1 | 2/2004 | Forbes |

FOREIGN PATENT DOCUMENTS

JP  02001308298 A  11/2001

OTHER PUBLICATIONS

Noda et al., "A $1.9$-$\mu m^2$ Loadless CMOS Four-Transistor SRAM Cell in a 0.18-$\mu$m Logic Technology", 1998, ULSI Device Development Laboratories, NEC Corporation, Japan, 5 pages.

* cited by examiner

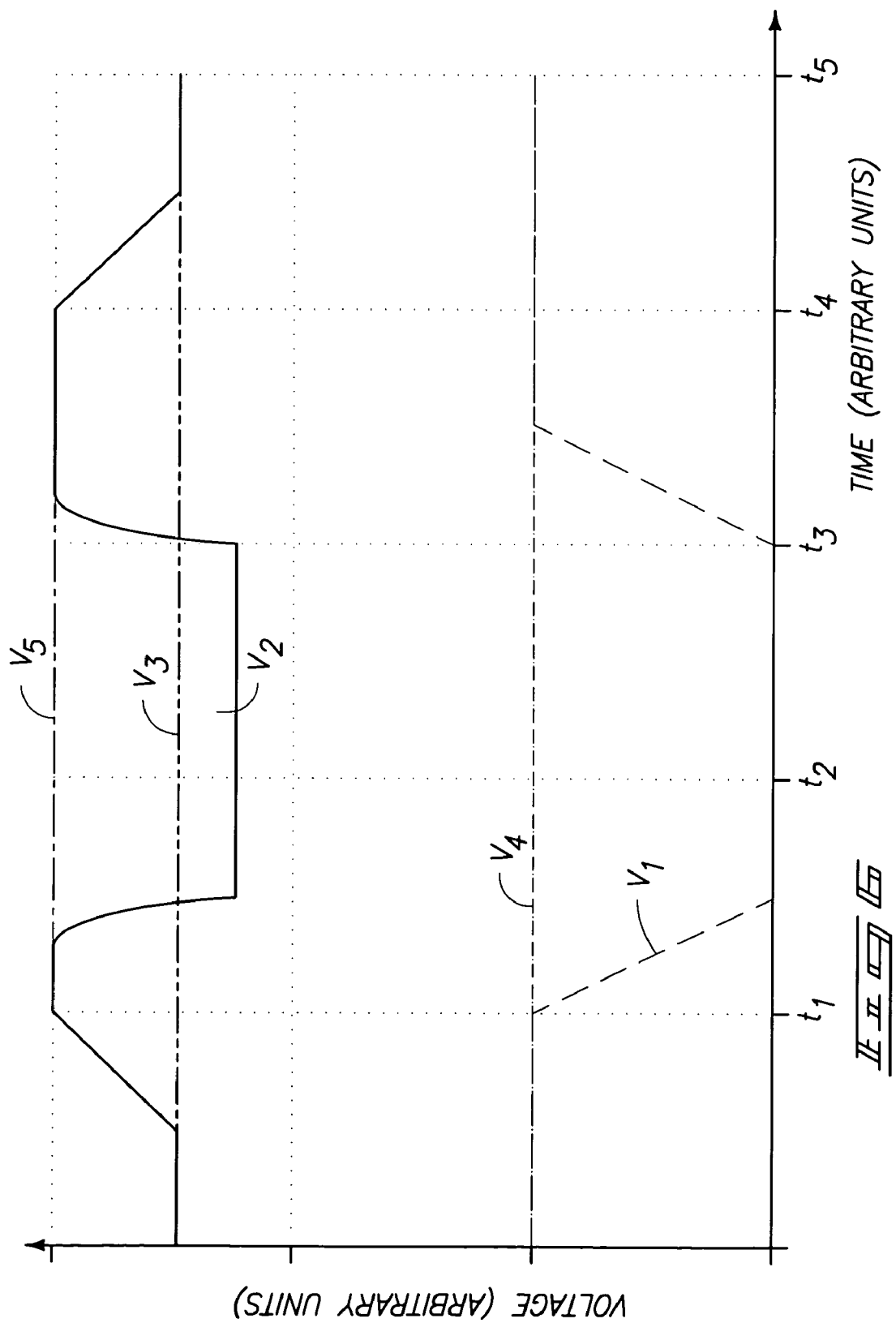

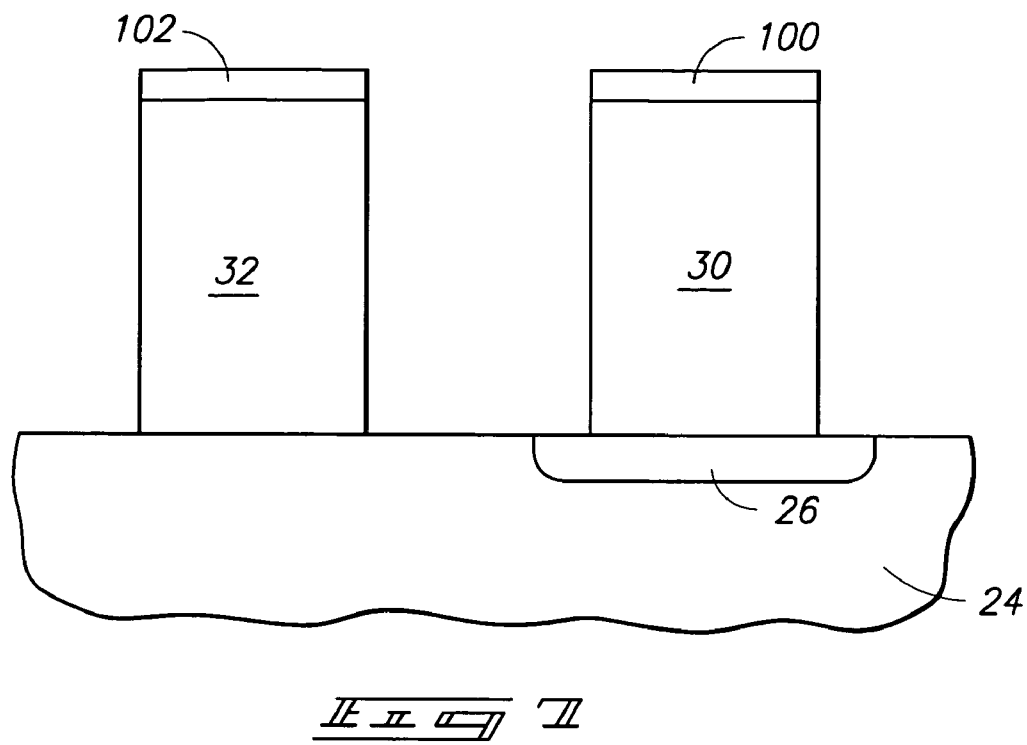
_FIG_ 7
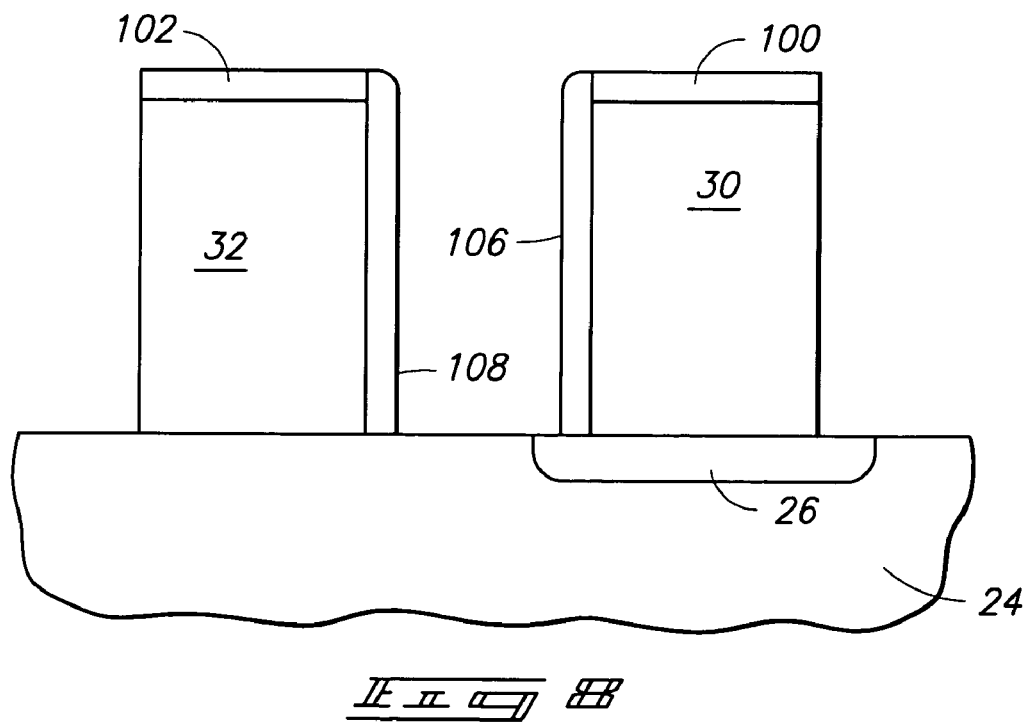
_FIG_ 8

COMPUTER SYSTEMS, PROCESSES FOR TURNING A SRAM CELL OFF, AND PROCESSES FOR WRITING A SRAM CELL AND PROCESSES FOR READING DATA FROM A SRAM CELL

RELATED PATENT DATA

This patent application is a Divisional Application of and claims priority to U.S. patent application Ser. No. 10/459,064, filed Jun. 10, 2003, now U.S. Pat. No. 6,919,254 entitled "Computer Systems, Processes For Forming A SRAM Cell, Processes For Turning A SRAM Cell Off, Processes For Writing A SRAM Cell and Processes for Reading Data From a SRAM Cell," naming Leonard Forbes as inventor which is a Divisional Application of U.S. patent application Ser. No. 10/202,551, filed Jul. 23, 2002 now U.S. Pat. No. 6,888,740, entitled "A Four Terminal Memory Cell, A Two-Transistor SRAM Cell, A SRAM Array, A Computer System, A Process For Forming A SRAM Cell, A Process For Turning A SRAM Cell Off, A Process For Writing A SRAM Cell and A Process for Reading Data From a SRAM Cell," naming Leonard Forbes as inventor, which is a Divisional Application of U.S. patent application Ser. No. 09/941,369, filed Aug. 28, 2001, now abandoned entitled "A Four Terminal Memory Cell, A Two-Transistor SRAM Cell, A SRAM Array, A Computer System, A Process For Forming a SRAM Cell, A Process For Turning a SRAM Cell OFF, A Process for Writing a SRAM Cell and A Process For Reading Data From a SRAM Cell," naming Leonard Forbes as inventor, the disclosures of which are hereby incorporated herein by reference.

TECHNICAL FIELD

This invention relates generally to a four terminal memory cell, a two-transistor SRAM cell, a SRAM array, a computer system, a process for forming a SRAM cell, a process for turning a SRAM cell OFF, a process for writing a SRAM cell and a process for reading data from a SRAM cell.

BACKGROUND OF THE INVENTION

The reduction in memory cell and other circuit size required for high density static random access memories (SRAMs) and other circuitry is a continuing goal in semiconductor fabrication. SRAMs are used in applications where high-speed random access memories provide significant performance advantages over other types of random access memories, such as dynamic random access memories (DRAMs). However, because SRAMs draw greater electrical power per stored datum than DRAMs, and also because SRAM cells typically consume significantly more silicon real estate than DRAM cells, marked performance advantages are needed in order to justify the increased real estate and power budgets necessitated by inclusion of SRAMs. A typical application for SRAM is in what is known as a "cache" memory.

One or more cache memories are typically coupled to a central processing unit (CPU) or an arithmetic logic unit (ALU) in a processor module or chip in order to store recently-executed instructions and/or data of current interest. Due to the fact that many processing tasks involve repetitive calculations and thus require the processor to re-execute recently-executed instructions (on, for example, a sequence of data points), there is a high probability of locating a needed instruction in the cache memory and thus of providing that instruction more rapidly via the cache memory than is possible with other kinds of memories and/or memory management schemes. As a result, SRAMs can provide significant performance advantages, particularly in situations where large datasets are frequently manipulated.

One conventional SRAM architecture uses six transistors and is referenced as a 6T architecture. Another conventional SRAM architecture includes four transistors and two load devices, usually either resistors or PMOS active load devices. Either of these architectures results in a memory cell requiring significantly more area than a DRAM cell, but each provides significantly improved access time when compared to DRAM arrays.

One example of a more compact SRAM cell is described in "A 1.9 $\mu m^2$ Loadless CMOS Four-Transistor SRAM Cell In A 0.18-$\mu m$ Logic Technology", by K Noda et al., presented at the 1998 International Electron Devices Meeting, 1998, pp. 643–6. The SRAM cell described therein achieves dimensions of 1.04 $\mu m \times 1.86\ \mu m$, or about 60 $F^2$, where F is related to a minimum lithographic feature size, as is described in more detail hereinbelow with reference to FIG. 2. While the area of this SRAM cell compares favorably to conventional SRAM cell areas (as described in Table 3 of the reference), the area of this SRAM cell is represented in the reference to be still at least three to six times that of conventional DRAM cells.

Accordingly, what is needed includes apparatus and methods for providing compact SRAM cells and memory cell arrays.

SUMMARY

In a first aspect, the present invention includes a two transistor memory cell for an $8F^2$ SRAM array. The two-transistor SRAM cell includes a first FET. The first FET is an ultrathin FET of a first polarity type and includes a gate, a source and a drain. The source is coupled to a first control line. The SRAM cell also includes a second FET. The second FET is an ultrathin FET of a second polarity type and includes a gate, a source and a drain. The second FET source is coupled to the first FET gate. The second FET gate is coupled to the first FET drain and the second FET source is coupled to a first potential. The SRAM cell further includes a first load device that is coupled between a second potential and the first FET gate. The SRAM cell additionally includes a second load device coupled between the second FET gate and a second control line.

In another aspect, the present invention includes a computer system. The computer system includes a central processing unit, an input interface and a memory device coupled to the central processing unit. The memory device is configured to store instructions and data for use by the central processing unit. The memory device includes a SRAM array formed from cells each including a first load device and a first ultrathin transistor having a power electrode coupled to the first load device. The cells also each include a second load device and a second ultrathin transistor including a power electrode coupled to the second load device. The first load device is merged with a control electrode of the second ultrathin transistor and vice versa.

In a further aspect, the present invention includes a process for forming a SRAM cell having an area of $8F^2$, or less, wherein F represents one-half of a minimum lithographic pitch of the SRAM cell. The process includes providing a semiconductive substrate having a first conductivity type and forming a diffusion region of a second conductivity type different than the first conductivity type in the substrate. The diffusion region is configured to act as a row address line. The process also includes forming first and second dielectric pillars on the substrate. The first and second pillars each have respective plan view areas of about $F^2$ and are separated by a distance of about F. One of the first and second pillars is formed atop the diffusion region and another of the first and second pillars is not formed atop the diffusion region. The process further includes forming first and second ultrathin transistors and first and second load devices in a space between the first and second pillars. The first load device is merged with the second ultrathin transistor and the second load device is merged with the first ultrathin transistor.

In a yet further aspect, the present invention includes a process for writing a SRAM cell to an ON state. The SRAM cell includes two switches. One of the two switches is coupled to a row address line and a column address line. The process includes modifying a voltage coupled to the row address line to cause a voltage applied to a control electrode of the one switch to exceed a threshold voltage for that switch.

BRIEF DESCRIPTION OF THE DRAWINGS

Embodiments in accordance with the present invention are described below with reference to the following drawings.

FIG. 6 is a simplified graph of voltages within the SRAM cell of FIGS. 1–4 exemplifying some aspects of operation thereof, in accordance with an embodiment of the present invention.

FIGS. 7–12 are simplified side views, in section, illustrating aspects of a process for fabrication of the SRAM cell of FIGS. 1–4, in accordance with an embodiment of the present invention.

DETAILED DESCRIPTION

This disclosure of embodiments in accordance with the present invention is submitted in furtherance of the constitutional purposes of the U.S. Patent Laws "to promote the progress of science and useful arts" (Article 1, Section 8).

Figure 1:
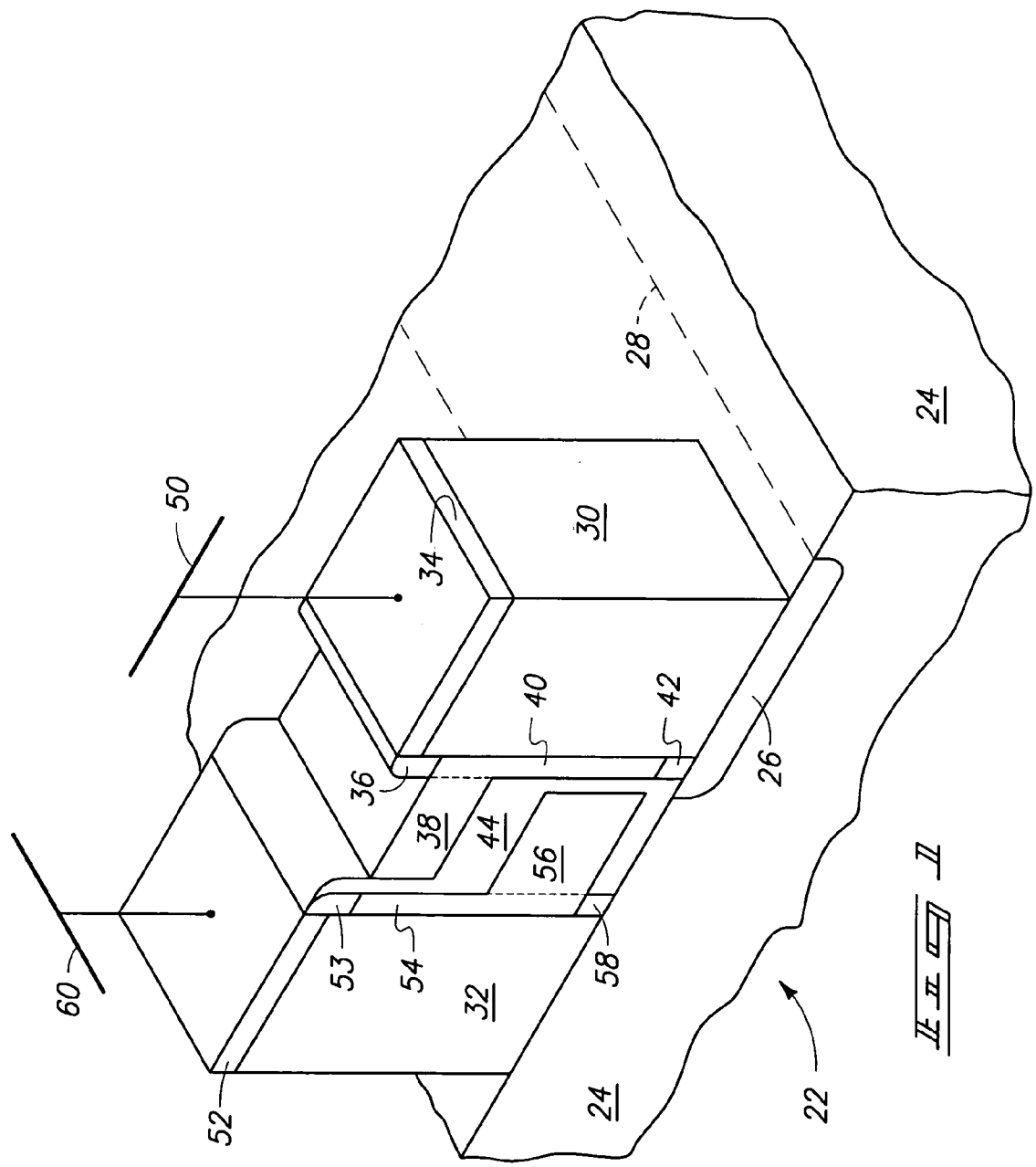
FIG. 1 is a simplified isometric view, shown in partial cutaway, of an $8F^2$ memory cell for a SRAM, in accordance with an embodiment of the present invention.

FIG. 1 is a simplified isometric view, shown in partial cutaway, of an $8F^2$ memory cell 22 for a SRAM, in accordance with an embodiment of the present invention. The SRAM cell 22 is formed on a semiconductive substrate 24.

As used herein, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In one embodiment, the semiconductive substrate 24 includes semiconductive material of a first conductivity type. In one embodiment, the semiconductive substrate 24 includes p-type semiconductive material. In one embodiment, the semiconductive substrate 24 includes monocrystalline silicon, which may be p-type.

A diffusion region 26 having a second conductivity type, different than the first conductivity type, is formed in the substrate 24 using conventional technology. The diffusion region 26 forms an elongated shape comprising a row address line 28 that is coupled to a group or row of SRAM cells 22. In one embodiment, the diffusion region 26 comprises a heavily doped region which may be n-type material.

A first pillar 30 is formed from an insulator atop the diffusion region 26, and a second pillar is formed from an insulator adjacent the first pillar 30. In one embodiment, the first and second pillars 30, 32 comprise silicon dioxide. In one embodiment, the pillars 30, 32 are formed to have a height above the substrate 24 of about 0.2 μm.

A semiconductive material 34 is disposed atop the pillar 30. In one embodiment, the semiconductive material 34 comprises conventional polycrystalline silicon.

In one embodiment, the pillar 30 and the semiconductive layer 34 have lateral dimensions on the order of 0.1 μm, however, other dimensions may be employed. In one embodiment, the semiconductive material 34 is heavily doped with the second conductivity type at some time subsequent to formation of the pillar 30, as is discussed below in more detail with reference to FIGS. 7–12.

Additional semiconductive material 36 is disposed at a top edge of a side of the pillar 30 facing the pillar 32 and is formed to include a portion that is electrically coupled to a portion of the semiconductive material 34. In one embodiment, the semiconductive material 36 is heavily doped with the second conductivity type.

In one embodiment, additional semiconductive material 38 is disposed elevationally beneath the semiconductive material 36 and in electrical contact therewith, along a side of the pillar 30. In one embodiment, the semiconductive material 38 comprises polycrystalline silicon that is moderately doped with the second conductivity type.

Further semiconductive material 40 is disposed elevationally beside and also elevationally below the semiconductive material 38 and in electrical contact therewith, along the side of the pillar 30. In one embodiment, the semiconductive material 40 comprises polycrystalline silicon that is moderately doped with the second conductivity type.

More semiconductive material 42 is disposed along the side of the pillar 30 between the diffusion region 26 and the semiconductive material 40 and is electrically coupled therebetween. In one embodiment, the semiconductive material 42 comprises polycrystalline silicon that is heavily doped with the second conductivity type.

A dielectric layer 44 is disposed along edges of the semiconductive materials 38, 40 and 42 that face the second pillar 32. The dielectric layer 44 insulates a lower surface of the semiconductive material 38. The dielectric layer 44 also extends across a surface of the substrate 24 extending from an outer edge of the semiconductive material 42 towards the second pillar 32.

A column address line 50 is conventionally formed elevationally above the semiconductive material 34 and in electrical contact therewith. The column address line 50 is also electrically coupled to other SRAM cells 22 (not illustrated) along an axis that is not parallel to the word line or row address line 28 and that may be orthogonal therewith. Electrical selection of one of the column address lines 50 and one of the row address lines 28 allows a specific one of the SRAM cells 22 to have data written to or read from the specific one of the SRAM cells 22.

The second pillar 32 includes a top surface having semiconductive material 52 disposed thereon. In one embodiment, the semiconductive material 52 comprises polycrystalline silicon that is heavily doped with the first conductivity type at some time subsequent to formation of the pillar 32. In one embodiment, the first and second pillars 30, 32 and the semiconductive materials 34, 52 are initially formed in common processing acts and the semiconductive materials 34, 52 are doped during subsequent and different processing acts.

Additional semiconductive material 53 is disposed at a top edge of a side of the pillar 32 facing the pillar 30 and is formed to include a portion that is electrically coupled to a portion of the semiconductive material 52. In one embodiment, the semiconductive material 53 is heavily doped with the first conductivity type.

In one embodiment, additional semiconductive material 54 is disposed elevationally beneath the semiconductive material 53 and in electrical contact therewith, along the side of the pillar 32 facing the pillar 30. In one embodiment, the semiconductive material 54 comprises polycrystalline silicon that is moderately doped with the first conductivity type.

Further semiconductive material 56 is formed beside and also elevationally beneath the semiconductive material 54 and in electrical contact therewith, along the side of the pillar 30. In one embodiment, the semiconductive material 56 comprises polycrystalline silicon that is moderately doped with the first conductivity type.

More semiconductive material 58 is disposed along the side of the pillar 32 between semiconductive material comprising the substrate 24 and the semiconductive material 56 and is electrically coupled therebetween. In one embodiment, the semiconductive material 58 comprises polycrystalline silicon that is moderately doped with the first conductivity type.

The dielectric layer 44 electrically isolates the semiconductive materials 38, 40 and 42 from the semiconductive materials 53, 54, 56 and 58.

An electrical contact 60 couples the semiconductive material 52 to a suitable voltage. In one embodiment, the electrical contact 60 couples the semiconductive material 52 to a power supply voltage.

Figure 2:
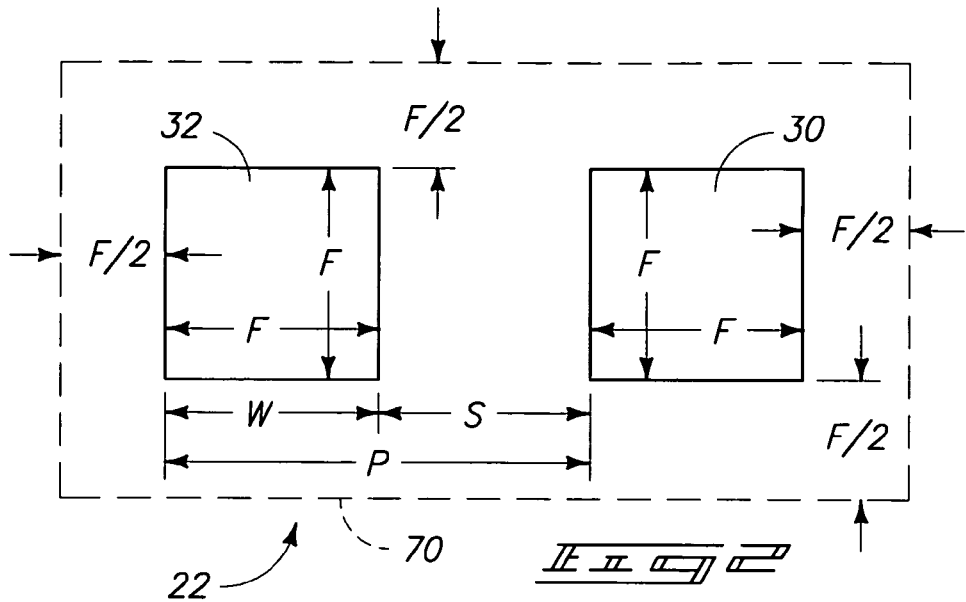
FIG. 2 is a simplified plan view of the $8F^2$ SRAM cell of FIG. 1, in accordance with an embodiment of the present invention.

FIG. 2 is a simplified plan view of a circuit layout for the $8F^2$ SRAM cell 22 of FIG. 1, in accordance with an embodiment of the present invention. The plan view of FIG. 2 illustrates a representation of an area 70 of the SRAM cell 22.

The area 70 for the SRAM cell 22 shown in FIG. 2 is equal to about 4F×2F, or less, where "F" is defined as equal to one-half of minimum pitch, with minimum pitch (i.e., "P") being defined as equal to the smallest distance of a line width (i.e., "W") plus width of a space immediately adjacent said line on one side of said line between said line and a next adjacent line in a repeated pattern within the array (i.e., "S").

As shown in FIG. 2, S and W are represented as being approximately equal, with the result that the area 70 of the SRAM cell 22 may be estimated by substituting suitable fractions or multiples of F (as shown in FIG. 2) for dimensions that technically are actually fractions or multiples of S, W or P. Thus, in the preferred implementation, the consumed area 70 of any given SRAM cell 22 is no greater than about $8F^2$. As a result, the SRAM cell 22 is compact.

Figure 3:
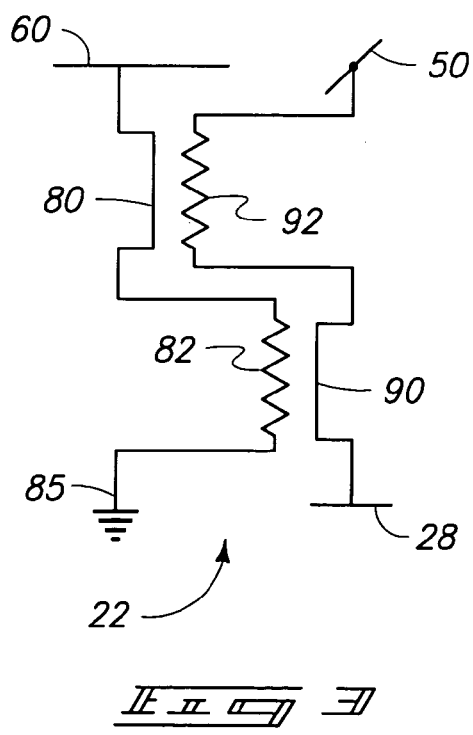
FIG. 3 is a simplified schematic diagram illustrating some aspects of the SRAM cell of FIGS. 1 and 2, in accordance with an embodiment of the present invention.

FIG. 3 is a simplified schematic diagram illustrating some aspects of the SRAM cell 22 of FIGS. 1 and 2, in accordance with an embodiment of the present invention. The simplified schematic diagram of FIG. 3 is intended to convey a limited number of concepts with respect to the SRAM cell 22 and is not intended to be interpreted as a literal or complete schematic diagram.

The SRAM cell 22 may be viewed as including a first switch 80 having a first load electrode coupled to the electrical contact 60 and a second load electrode. A first resistor 82 includes a first terminal coupled to the second load electrode and a second terminal 85 electrically coupled to the substrate 24, represented as ground in FIG. 3. A second switch 90 includes a first load electrode coupled to the row address line 28 and a second load electrode. A second resistor 92 includes a first terminal electrically coupled to the second load electrode of the second switch 90 and a second terminal electrically coupled to the column address line 50.

Figure 4:
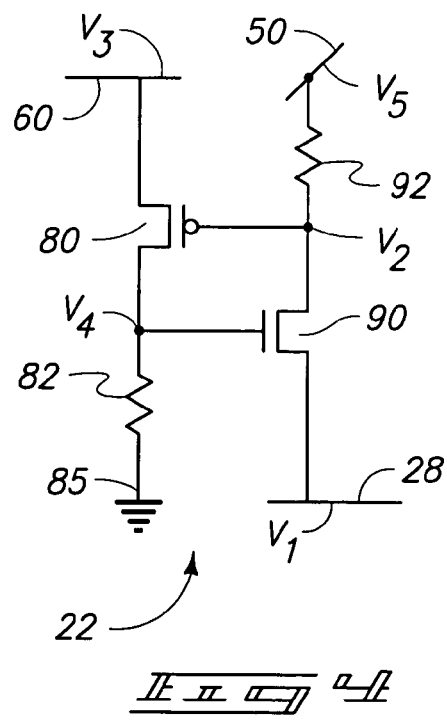
FIG. 4 is a simplified schematic diagram of the SRAM cell of FIGS. 1 and 2, in accordance with an embodiment of the present invention.

FIG. 4 is a simplified schematic diagram of the SRAM cell 22 of FIGS. 1 and 2, in accordance with an embodiment of the present invention. The simplified schematic diagram of FIG. 4 is intended to convey a limited number of concepts with respect to the SRAM cell 22 and is not intended to be interpreted as a literal or complete schematic diagram. In the embodiment shown in FIG. 4, five voltages, designated $V_1$, $V_2$, $V_3$, $V_4$ and $V_5$, respectively, are identified.

The first voltage $V_1$ corresponds to the row address line 28. The second voltage $V_2$ is represented as being derived from a hypothetical node corresponding an electrical junction between the second resistor 92 and the second load electrode of the second switch 90. The third voltage $V_3$ corresponds to the electrical contact 60. The fourth voltage $V_4$ is represented as being derived from a hypothetical node corresponding an electrical junction between the first resistor 82 and the second load electrode of the first switch 80. The fifth voltage $V_5$ corresponds to the column address line 50.

The first switch 80 of FIG. 3 corresponds to a PMOS transistor 80 shown in FIG. 4. The PMOS transistor 80 includes a control electrode or gate coupled to the voltage $V_2$. The second switch 90 of FIG. 3 corresponds to a NMOS transistor 90 shown in FIG. 4. The NMOS transistor 90 includes a control electrode or gate coupled to the voltage $V_4$.

With reference now to FIGS. 1, 3 and 4, the first resistor 82 corresponds to the semiconductive material 56 and an adjacent portion of the semiconductive material 54. The first transistor 90 includes a source/drain formed by the semiconductive material 53 that corresponds to the first load electrode of FIG. 3 and another source/drain represented by the semiconductive material 58.

A portion of the semiconductive material 54 (FIG. 1) not adjacent to the semiconductive material 56 forms a body of the PMOS FET 80 (FIG. 4), an adjacent portion of the dielectric material 44 corresponds to gate oxide, and the semiconductive material 38 corresponds to both the second resistor 92 and the control electrode or gate for the PMOS FET 80.

A portion of the semiconductive material 40 not adjacent the semiconductive material 38 forms a body of the NMOS FET 90, an adjacent portion of the dielectric material 44 corresponds to gate oxide, and the semiconductive material 56 corresponds to both the first resistor 82 and the control electrode or gate for the NMOS FET 90. The semiconductive regions 38 and 56 thus each form both a gate electrode for a respective one of the switches 80 and 90 and a distributed resistor 92, 82.

The switches 80 and 90 (FIG. 3) thus may each be formed as an ultrathin transistor. As used herein, the "ultrathin transistor" is defined to mean a transistor formed of a semiconductor material having a dimension transverse to the gate that is much smaller than any other dimension of semiconductor material forming the transistor, and that further has a thickness less than a minimum lithographic feature size with which the ultrathin transistor is formed.

All cells 22 in a particular row (i.e., coupled to a particular row address line 28) may be reset or turned OFF by increasing the row address line 28 voltage $V_1$ above a threshold voltage $V_{TN}$ of the second switch 90. In one embodiment, the voltage $V_1$ is raised, for example, to 0.7 volts. In one embodiment, the threshold voltage $V_{TN}$ is about 0.35 volts. In one embodiment, the second voltage $V_2$ then rises to within a threshold voltage VTP (associated with the first transistor 80) of the voltage $V_3$, turning the first switch 80 OFF. In one embodiment, the second voltage $V_2$ then rises to 0.7 volts, turning the first switch 80 OFF.

In one embodiment, a read operation is accomplished by measuring additional or increased current through the column address line 50 when a total voltage difference between the row address line 28 and the column address line 50 is increased. In one embodiment, the voltage difference is increased by lowering the row address line 28 voltage $V_1$ below ground reference potential by an amount less than $V_{TN}$. When the second switch 90 is ON, it will conduct more current through the column address line 50. When the second switch 90 is OFF, no additional current will flow. This allows the data stored in the SRAM cell 22 to be read.

Figure 5:
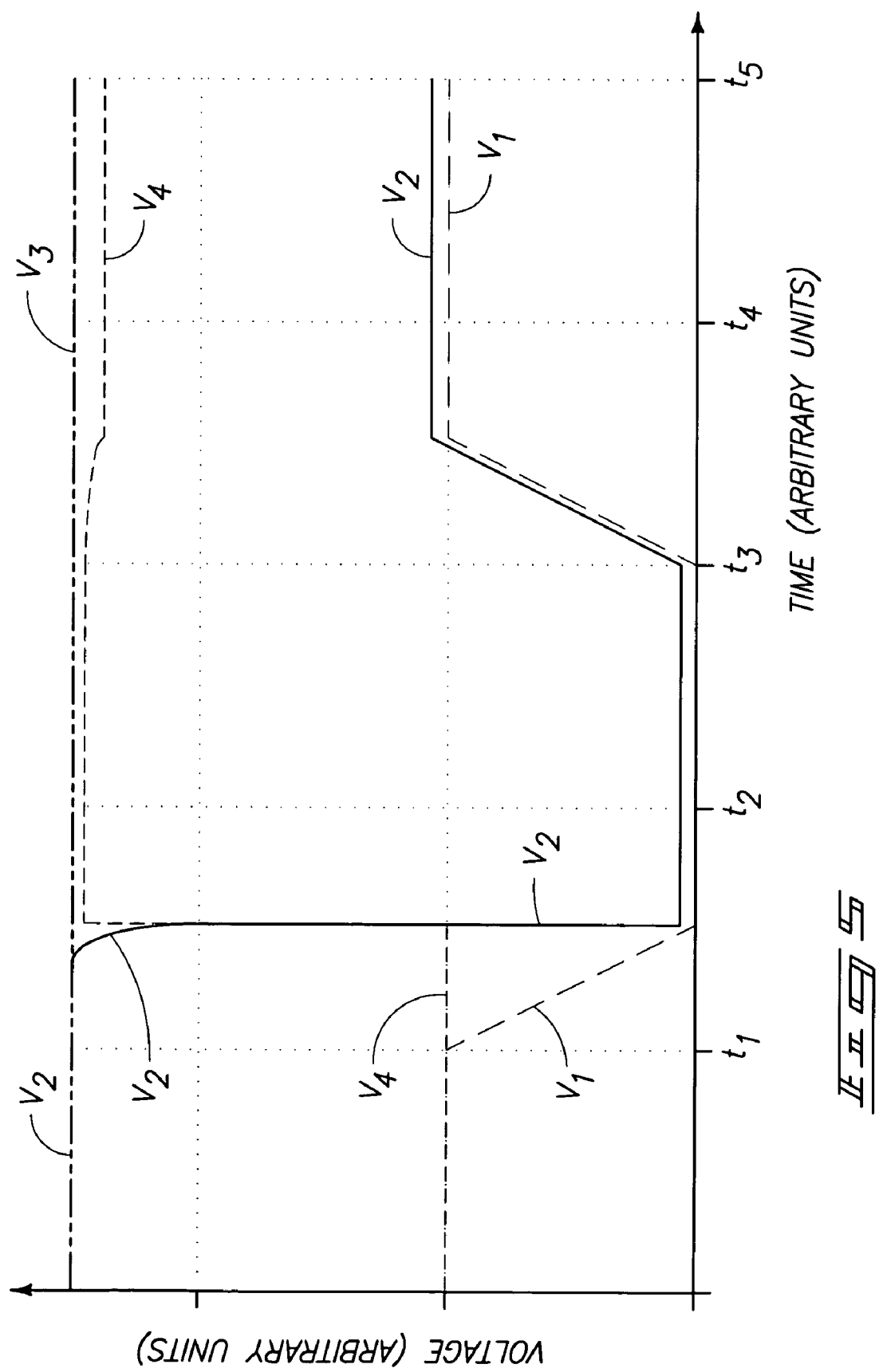
FIG. 5 is a simplified graph of voltages within the SRAM cell of FIGS. 1–4 exemplifying some aspects of operation thereof, in accordance with an embodiment of the present invention.

FIG. 5 is a simplified graph of voltages within the SRAM cell 22 of FIGS. 1–4 exemplifying some aspects of operation thereof, in accordance with an embodiment of the present invention. The graphs of FIGS. 5 and 6 were derived using SPICE (simulation program for integrated circuit engineering) models that are shown below in Table I (FIG. 5) and Table II (FIG. 6). The time and voltage scales of FIGS. 5 and 6 are in arbitrary units, as noted. In the simulation from which FIGS. 5 and 6 were derived, the time increments shown correspond to two microseconds per division, however, other time scales, switching speeds etc. are also possible.

TABLE I

SPICE model for turning ON the SRAM cell 22 to write data to the SRAM cell 22.

```
*sram turn off cell to on state
vdd    3  0  pulse (0.7 0.7 1μ 1μ 1μ 10μ 13μ)
vbl    1  0  pulse (0.0 −0.5 2.0μ 1μ 1μ 1μ 3μ 13μ)
vnpwr  5     0 pulse ( 0.7 0.7 1μ 1μ 1μ 6μ 13μ)
r1     4  0  2000k
r2     2  5  800k
m1     2  4  1  0 ntran  l=1μ  w=1μ
m2     4  2  3  3 ptran  l=1μ  w=1μ
```

TABLE I-continued

SPICE model for turning ON the SRAM cell 22 to write data to the SRAM cell 22.

```
.op
.model ptran pmos (level=3 tox=110e-10 vto=-0.35 kp=20e-06)
.model ntran nmos (level=3 tox=95e-10 vto=0.35 kp=50e-06)
.tran 0.01μ 10μ
.probe
.end
```

In one embodiment corresponding to the SPICE model shown in Table I, initially (i.e., at left axis) voltages $V_1$ and $V_4$ are zero volts, and initially voltages $V_2$ and $V_3$ are approximately 0.7 volts, however, other voltages are possible. In this embodiment, voltages $V_1$ and $V_2$ are approximately −0.5 volts between times $t_2$ and $t_3$.

In one embodiment, data may be written to the SRAM cell 22 by first turning all of the SRAM cells 22 along one row address line 28 to an OFF state, as described above. The column address line 50 is maintained at a constant voltage $V_5$, while the voltage $V_1$ on the row address line 28 is stepped below the reference ground potential, corresponding to an interval between times $t_1$ and $t_2$ in FIG. 5. In order to turn the NMOS transistor 90 ON, the voltage $V_1$ on the row address line 28 needs to be set to a value below the threshold voltage $V_{TN}$ for the NMOS transistor 90. This causes the second switch 90 to turn ON.

As a result, the node voltage $V_2$ goes low, turning the first switch 80 ON. When both the first and second switches 80 and 90 are turned ON in this manner, the row address line 28 may be returned to the steady state or ground potential and both the first and second switches 80, 90 will remain ON, with $V_2$ LOW and $V_4$ HIGH.

FIG. 6 is a simplified graph of voltages within the SRAM cell 22 of FIGS. 1–4 exemplifying some aspects of operation thereof, in accordance with an embodiment of the present invention.

To cause a SRAM cell 22 that is on the row address line 28 to remain in an OFF state while at least one other SRAM cell 22 on that row address line 28 is being set to an ON state, the voltage $V_5$ on the column address line 50 coupled to the SRAM cell 22 that is to remain in the OFF state is raised as shown at time $t_1$. This prevents the voltage $V_2$ from going low enough to turn the first switch 80 ON, with the result that the SRAM cell 22 will remain in an OFF state.

In one embodiment, corresponding to the SPICE model shown below in Table II, the voltage $V_5$ is switched from 0.7 to 1.0 volts, however, other voltages are possible. In this model, the voltages $V_1$ and $V_4$ are initially (at left axis) zero volts, with voltage $V_1$ having a value of −0.5 volts at least between times $t_2$ and $t_3$.

TABLE II

SPICE model for turning OFF the SRAM cell 22 to write data to the SRAM cell 22.

```
*sram leave off cell in off state in same row
vdd    3  0  pulse (0.7 0.7 1μ 1μ 1μ 10μ 13μ)
vbl    1  0  pulse (0.0 −0.5 2.0μ 1μ 1μ 3μ 13μ)
vnpwr  5     0 pulse ( 0.7 1.0 1μ 1μ 1μ 6μ 13μ)
r1     4  0  2000k
r2     2  5  800k
m1     2  4  1  0 ntran  l=1μ  w=1μ
m2     4  2  3  3 ptran  l=1μ  w=1μ
.op
.model ptran pmos (level=3 tox=110e-10 vto=-0.35 kp=20e-06)
```

TABLE II-continued

SPICE model for turning OFF the SRAM cell 22 to write
data to the SRAM cell 22.

.model ntran nmos (level=3 tox=95e−10 vto=0.35 kp=50e−06)
.tran 0.01µ 10µ
.probe
.end The results shown in FIGS. 5 and 6 show that selected SRAM cells 22 in a given row may be selectively programmed to be either ON or OFF, allowing binary data (i.e., ones and zeros) to be stored in respective ones of the SRAM cells 22.

When the SRAM cell 22 is initially OFF and only the column address line 50 voltage $V_5$ increases, for example, from 0.7 to 1.0 volts, that SRAM cell 22 remains OFF (in fact, the cell 22 is driven even farther to the OFF state, because the PMOS transistor 80 gate is driven even more positive).

When the SRAM cell 22 is initially ON and the column address line 50 voltage $V_5$ increases, there is only a small increase in the voltage $V_2$ since the SRAM cell 22 is ratioed much as a static inverter is. In other words, the resistance of the NMOS transistor 90 is low, when the NMOS transistor 90 is ON, compared to the resistance of the resistor 92. The PMOS transistor 80 remains ON, $V_2$ remains LOW and $V_4$ remains HIGH. Thus, when a SRAM cell 22 is not selected by both the row address line 28 and the column address line 50, the states of the SRAM cells 22 are not disturbed.

FIGS. 7–12 are simplified side views, in section, illustrating aspects of a process for fabrication of the SRAM cell 22 of FIGS. 1–4, in accordance with an embodiment of the present invention.

FIG. 7 illustrates the pillars 30 and 32, in accordance with an embodiment of the present invention. The pillar 30 is shown formed atop the diffusion region 26 that forms the row address line 28 of FIG. 1. Caps 100 and 102 formed of semiconductive material are disposed atop the pillars 30, 32, respectively.

In one embodiment, the first pillar 30 and the material 34 are fabricated by forming a dielectric layer (not illustrated) and then forming a lightly doped or not intentionally doped semiconductive layer (not illustrated). Formation of these layers is followed by conventional masking and conventional anisotropic etching of the semiconductive layer to provide caps 100, 102. This is followed by conventional anisotropic etching of the dielectric layer to form pillars 30, 32 and stripping of the mask to provide the structure shown in FIG. 7. The semiconductor material 100 is later doped to provide the doped semiconductor material 34 of FIG. 1.

FIG. 8 illustrates the scenario of FIG. 7 at a later stage in processing, in accordance with an embodiment of the present invention. Semiconductive material (not illustrated) has been formed over the features of FIG. 7 and has been stripped from some sides of the pillars 30, 32, but not from each side of the pillars 30, 32 that faces the other of the pillars 30, 32.

In one embodiment, a first conventional anisotropic etch is employed to remove portions of the deposited semiconductive material that are disposed on horizontal surfaces of the structures shown in FIGS. 7 and 8. A subsequent conventional masking and etching operation is then employed to leave the semiconductive material 106, 108 disposed on only one side of each of the pillars 30, 32, where the one sides each face the other of the pillars 30, 32.

Thus, semiconductive material 106 is disposed along a face of the pillar 30 that faces the pillar 32, but is not disposed on the substrate 24 or on faces of the pillar 30 that do not face the pillar 32. Similarly, semiconductive material 108 is disposed along a face of the pillar 32 that faces the pillar 30, but is not disposed on the substrate 24 or on faces of the pillar 30 that do not face the pillar 30. In one embodiment, the semiconductive material 106, 108 comprises polycrystalline silicon. In one embodiment, the semiconductive material 106, 108 is formed to have a thickness (measured along the horizontal in the view shown in FIG. 8) of about 20 nm., although thinner or thicker semiconductive materials 106, 108 may be employed.

Conventional masking and doping may be used dope the semiconductive material 106 to form the semiconductive material 34. Similarly, conventional masking and doping may be used to dope the semiconductive material 108 to form the semiconductive material 52.

In one embodiment, the semiconductive material 106, 108 is then conventionally heat treated to cause the semiconductive material to recrystallize. In one embodiment, the semiconductive material 106, 108 is recrystallized along a vertical axis of the pillars 30, 32, respectively.

Figure 9:
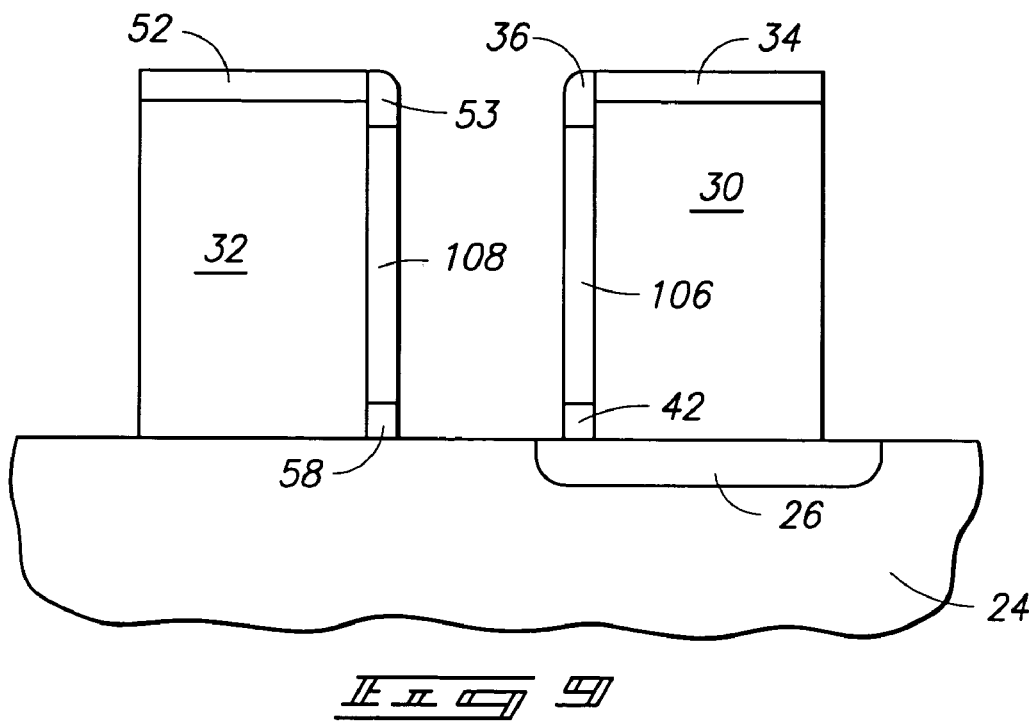

FIG. 9 illustrates the scenario of FIG. 8 at a later stage in processing, in accordance with an embodiment of the present invention. The heat treatment associated with recrystallization of the semiconductive material 106, 108 also causes lower regions 42 and 58, and upper regions 36 and 53, to become doped by outdiffusion.

In one embodiment, the semiconductive material 42 becomes heavily doped with dopant of the second conductivity type by outdiffusion from the diffusion region 26. In one embodiment, the semiconductive material 42 becomes doped heavily n-type. In one embodiment, the semiconductive material 36 becomes heavily doped with dopant of the second conductivity type by outdiffusion from the semiconductive material 34. In one embodiment, the semiconductive material 36 becomes heavily n-type.

In one embodiment, the region 58 becomes moderately doped with dopant of the first conductivity type by outdiffusion from the substrate 24. In one embodiment, the semiconductive material 58 becomes moderately p-type. In one embodiment, the semiconductive material 53 becomes heavily doped with dopant of the first conductivity type by outdiffusion from the semiconductive material 52. In one embodiment, the semiconductive material 53 becomes heavily p-type.

Figure 10:
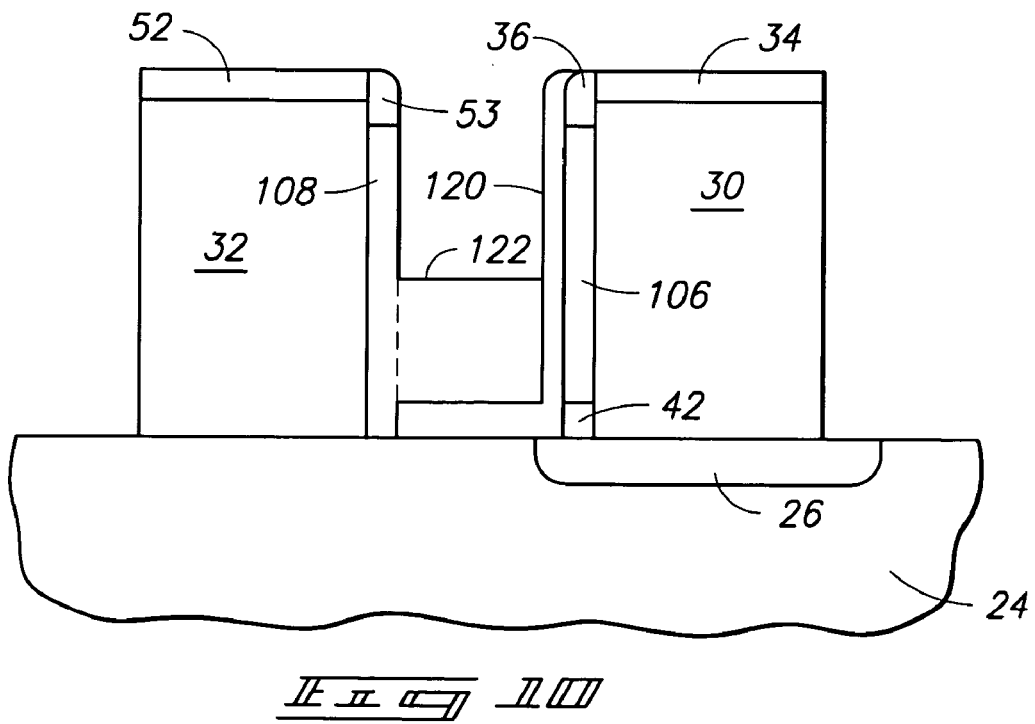

FIG. 10 illustrates the scenario of FIG. 9 at a later stage in processing, in accordance with an embodiment of the present invention. A dielectric layer 120 is formed, for example by conventional CVD. In one embodiment, chemical-mechanical polishing is used to remove the dielectric layer 120 from the semiconductive materials 34 and 52 and to planarize portions of the dielectric layer 120 to be level with tops of the semiconductive materials 34 and 52. In one embodiment, conventional masking and etching are then employed to remove portions of the dielectric layer 120 from areas other than a portion of the substrate 24 disposed between the pillars 30, 32.

A dielectric layer (vertical portion of dielectric layer 120, FIG. 10) is then formed along the semiconductive materials 42, 106 and 36. In one embodiment, conventional oxidation is used to form the vertical portion of the dielectric layer 120 of silicon dioxide (corresponding to tox=95e−10 in Tables I and II or a gate dielectric thickness of 95 Angstroms).

Conventional masking and etching are then employed to remove portions of the dielectric layer 120 from areas other than along the semiconductive materials 42, 106 and 36.

Conventional deposition techniques are then employed to deposit semiconductor material 122, followed by conventional chemical-mechanical polishing for planarization and etching to recess the semiconductor material 122 to provide the structure shown in FIG. 10.

In one embodiment, the semiconductor material 122 comprises semiconductor material that is lightly doped with the second conductivity type. In one embodiment, the semiconductor material 122 comprises lightly p-type doped semiconductor material. In one embodiment, conventional CVD is used to form the semiconductor material 122. In one embodiment, the semiconductive material 122 comprises polycrystalline silicon. In one embodiment, 200 nm of lightly-doped semiconductive material 122 is formed.

Figure 11:
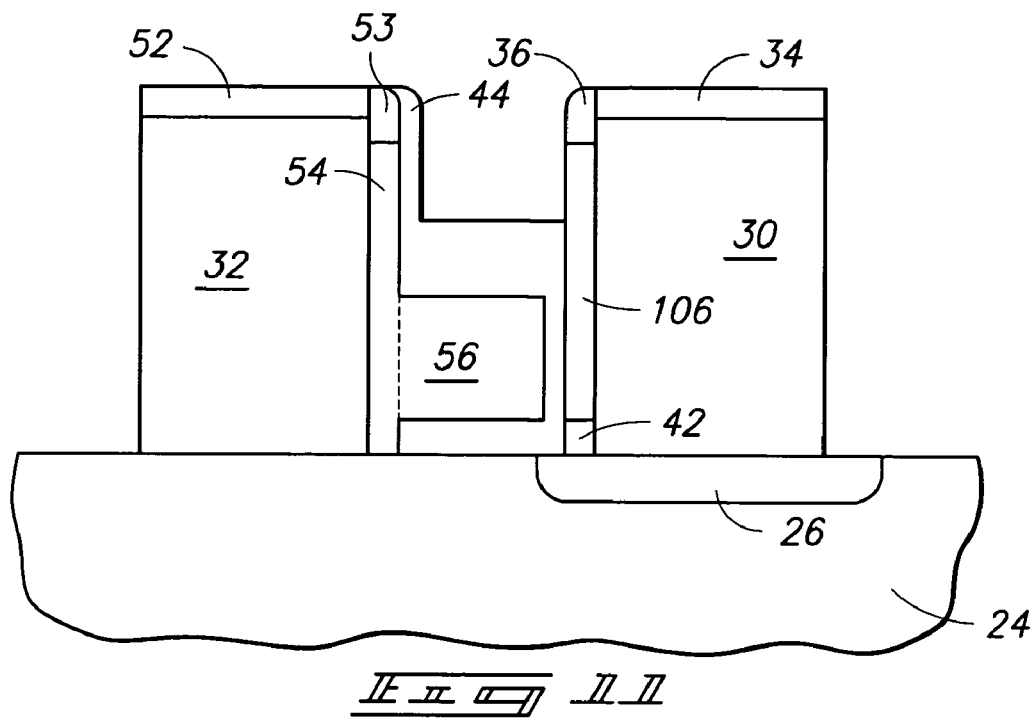

FIG. 11 illustrates the scenario of FIG. 10 at a later stage in processing, in accordance with an embodiment of the present invention. Portions of the dielectric layer 44 adjacent the semiconductive material 54, 53 and atop the semiconductive material 56 are then formed. In one embodiment, conventional oxidation is employed to form dielectric material 44 comprising silicon dioxide on exposed semiconductor surfaces, followed by conventional masking and etching to remove unwanted silicon dioxide and to provide the structure illustrated in FIG. 11. The vertical portion of the dielectric layer 44 adjacent the semiconductive material 54 forming a gate dielectric (corresponding to tox=110e−10 in Tables I and II or a gate dielectric thickness of 110 Angstroms) can be formed by conventional oxidation.

Figure 12:
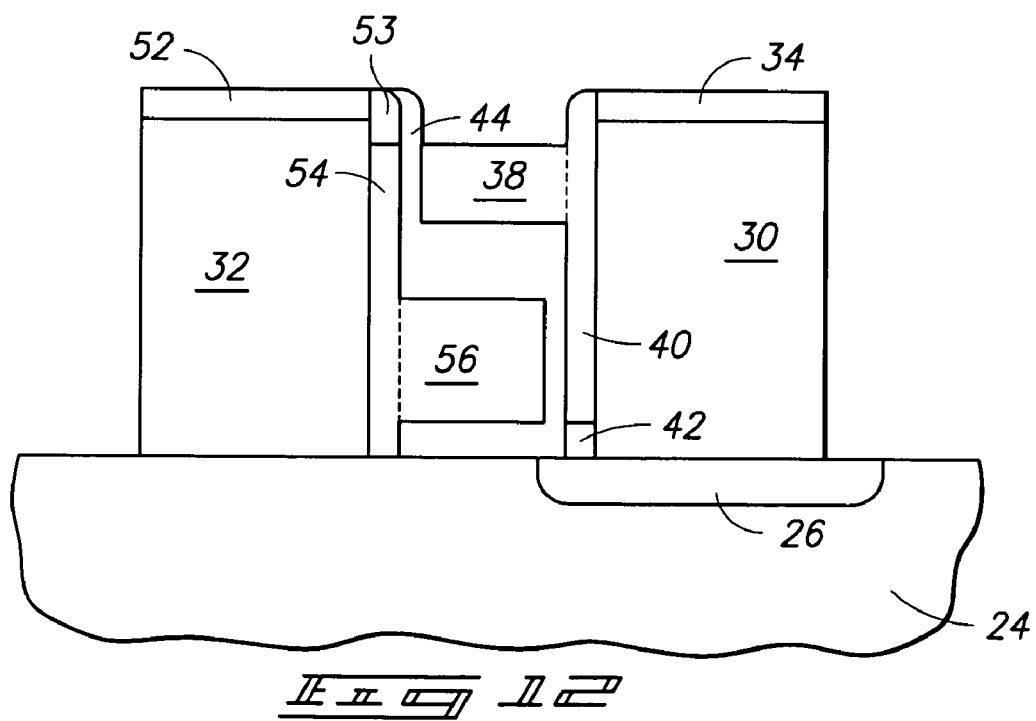

FIG. 12 illustrates the scenario of FIG. 11 at a later stage in processing, in accordance with an embodiment of the present invention. Conventional deposition techniques are then employed to deposit semiconductor material 38, followed by conventional chemical-mechanical polishing for planarization and etching to recess the semiconductor material 38 to provide the structure shown in FIG. 12.

In one embodiment, the semiconductor material 38 comprises lightly doped having the first conductivity type. In one embodiment, the semiconductor material 38 comprises lightly n-type doped semiconductor material. In one embodiment, conventional CVD is used to form the semiconductor material 38 In one embodiment, the semiconductive material 38 comprises polycrystalline silicon. In one embodiment, 200 nm of lightly-doped semiconductive material 38 is formed.

Conventional techniques are then employed provide protective dielectric material, such as CVD oxide, to planarize the protective dielectric material and to form interconnections, wiring and other circuit elements. As a result, a very efficient SRAM cell 22 is provided having a "footprint" of about $8F^2$. This is approximately a factor of five smaller than conventional planar SRAM structures. Data storage densities of up to about 1 gigabit -per square centimeter, or more, may be realized via the approach of the present invention.

Figure 13:
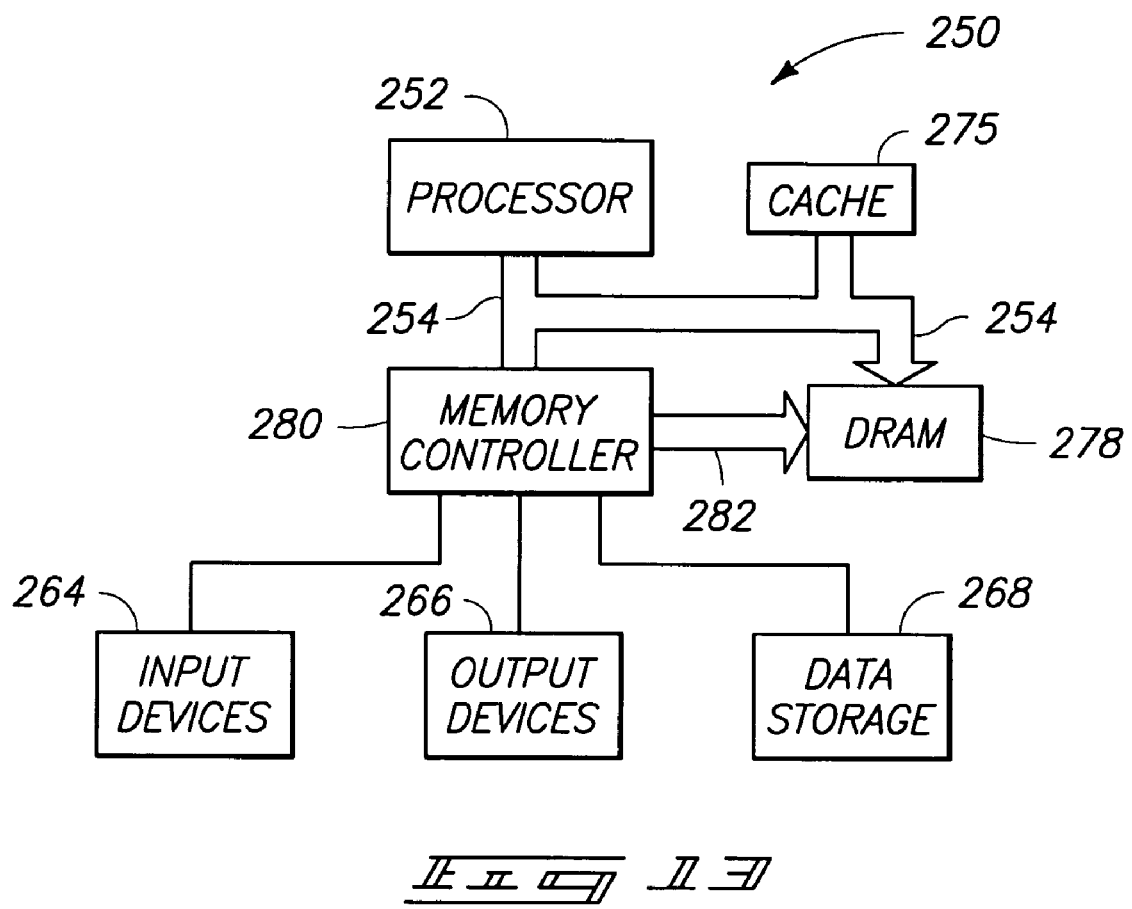
FIG. 13 is a simplified block diagram of a computer system including one or more memories using the SRAM cell of FIGS. 1 and 2, in accordance with an embodiment of the present invention.

FIG. 13 is a simplified block diagram of a computer system 250 including one or more cache memories 275 using the $8F^2$ SRAM cells 22 of FIGS. 1 and 2, in accordance with an embodiment of the present invention. The computer system 250 includes a processor 252 for performing various computing functions, such as executing specific software to perform specific calculations or tasks. The processor 252 includes a processor bus 254 that normally includes an address bus, a control bus and a data bus.

In addition, the computer system 250 includes one or more tactile input devices 264, such as a keyboard or a mouse, coupled to the processor 252 to allow an operator to interface with the computer system 250. Typically, the computer system 250 also includes one or more output devices 266 coupled to the processor 252, such output devices typically being a printer or a video terminal. One or more data storage devices 268 are also typically coupled to the processor 252 to allow the processor 252 to store data or retrieve data from internal or external storage media (not shown). Examples of typical storage devices 268 include hard and floppy disks, tape cassettes and compact disk read-only memories (CD-ROMs).

The processor 252 is also typically coupled to cache memory 275 by the processor bus 254, and to DRAM 278 through a memory controller 280. The memory controller 280 normally includes a control and address bus 282 that is coupled to the DRAM 278. Forming the SRAM 275 using the $8F^2$ architecture of the present invention allows the SRAM 275 to be compact, reducing the size and increasing the amount of available high speed cache memory of the overall system 250.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A process for reading data from a SRAM cell including a first transistor of a first conductivity type and a second transistor of a second conductivity type comprising:
   increasing a voltage across a portion of the cell including two power electrodes of one of the first and second transistors; and
   monitoring a current through the power electrodes of the one transistor.

2. The process of claim 1, wherein increasing comprises increasing the voltage by less than an amount represented by a turn-on voltage of the one transistor.

3. The process of claim 1, wherein the first transistor comprises an ultrathin PMOS transistor and the second transistor comprises an ultrathin NMOS transistor, and wherein:
   increasing comprises lowering a voltage impressed on a source of the NMOS transistor below a ground reference voltage; and
   monitoring comprises monitoring a drain current of the NMOS transistor.

4. The process of claim 1, further comprising:
   determining that a first logical state was stored in the SRAM cell when no current increase accompanies increasing; and
   determining that a second logical state different than the first logical state was stored in the SRAM cell when a current increase accompanies increasing.

5. The process of claim 1, wherein the first transistor comprises an ultrathin PMOS transistor having a gate, a source and a drain and the second transistor comprises an ultrathin NMOS transistor having a gate, a source and a drain, the NMOS transistor source being coupled to a row address line and the NMOS transistor drain being coupled to a column address line and wherein:
   increasing comprises reducing a potential applied to the row address line; and monitoring comprises monitoring a current through the column address line.

6. The process of claim 1, wherein the first transistor comprises an ultrathin PMOS transistor having a gate, a source and a drain and the second transistor comprises an ultrathin NMOS transistor having a gate, a source and a drain and wherein increasing comprises increasing a gate-source voltage of the NMOS transistor to a value that is less than a threshold voltage of the NMOS transistor.

* * * * *

UNITED STATES PATENT AND TRADEMARK OFFICE
CERTIFICATE OF CORRECTION

PATENT NO. : 6,999,351 B2
APPLICATION NO. : 10/820568
DATED : February 14, 2006
INVENTOR(S) : Forbes Page 1 of 1

It is certified that error appears in the above-identified patent and that said Letters Patent is hereby corrected as shown below:

Col. 10, line 15 please insert --to-- after "used".

Col. 11, line 40, please insert --material-- after "doped".

Col. 11, line 48, please insert --to-- after "employed".

Signed and Sealed this

First Day of May, 2007

JON W. DUDAS
*Director of the United States Patent and Trademark Office*